United States Patent
Tseng et al.

(10) Patent No.: US 6,549,157 B1
(45) Date of Patent: Apr. 15, 2003

(54) DIGITAL-TO-ANALOG CONVERTING DEVICE AND METHOD USED IN HOME NETWORKING SYSTEM WITH COMPENSATION MECHANISM TO REDUCE CLOCK JITTER

(75) Inventors: Yang-Chung Tseng, Chung-Ho (TW); Ching-Kae Tzou, Chu-Bei (TW); Shuenn-Ren Liu, Taipei (TW); Shih-Chung Yin, Hsin-Chu (TW); Min-Chieh Chen, Hsin-Chu (TW)

(73) Assignee: Silicon Integrated Systems Corp. (TW)

( * ) Notice: Subject to any disclaimer, the term of this patent is extended or adjusted under 35 U.S.C. 154(b) by 0 days.

(21) Appl. No.: 10/020,183

(22) Filed: Dec. 18, 2001

(51) Int. Cl.[7] ................................. H03M 1/66
(52) U.S. Cl. ........................ 341/147; 341/144
(58) Field of Search ................ 341/144, 147, 341/151

(56) References Cited

U.S. PATENT DOCUMENTS 5,574,455 A * 11/1996 Hori et al. ................... 341/144
5,880,689 A * 3/1999 Kushner ....................... 341/144
2001/0019313 A1 * 9/2001 Takahashi et al. ........... 341/147

* cited by examiner

*Primary Examiner*—Howard L. Williams
(74) *Attorney, Agent, or Firm*—Lowe Hauptman Gilman & Berner, LLP

(57) ABSTRACT

A digital-to-analog converting method operating under two clock signals of different periods is disclosed. The method includes steps of monitoring a phase relationship between the two clock signals; starting transmission of a plurality of pre-stored series of waveform samples in response to each rising edge of the first clock signal, wherein a phase difference is present between every two adjacent series of waveform samples; outputting the waveform samples of each series in response to rising edges of the second clock signal; and selecting one of the plurality of pre-stored sets of waveform samples to be converted into an analog signal according to the phase relationship. The various pre-stored series of waveform samples having therebetween phase differences are optionally used for phase compensation so as to reduce the clock jitter between the two clock signals. A digital-to-analog converter for implementing the above-mentioned method is also disclosed.

9 Claims, 4 Drawing Sheets

DIGITAL-TO-ANALOG CONVERTING DEVICE AND METHOD USED IN HOME NETWORKING SYSTEM WITH COMPENSATION MECHANISM TO REDUCE CLOCK JITTER

FIELD OF THE INVENTION

The present invention relates to a digital-to-analog converting device and method, and more particular to a digital-to-analog converting device and method operating under two clock signals of different periods. For example, the device and the method can be used with reduced jitter in waveform pulse generated by the HomePNA 1.0/2.0 compliant modules, and any other digital communication systems that utilize pre-synthesized waveforms as sources for generating transmitted signals.

BACKGROUND OF THE INVENTION

Clock jitter is always an important issue in a communication system. A large clock jitter inherent in signal transmission may seriously degrade system performance. In the international Home Networking standard HomePNA 1.0, for example, information is carried by signals transmitted and processed in sequence. Therefore, the permissive range of a clock jitter is highly restricted in Home Networking environment.

In a HomePNA 2.0 compliant system, it should be backward compatible with the HomePNA 1.0 system. Therefore, a HomePNA 1.0 compliant module is generally included in a HomePNA 2.0 compliant modem, and the clock frequency of a digital-to-analog converter (DAC) of the system is selected to meet both timing or clock frequency requirements in HomePNA 1.0 as well as in HomePNA 2.0 under the constraints of hardware complexity and system performance.

The DAC clock frequency selected mainly for HomePNA 2.0 applications, unfortunately, is not an integer multiple of the system clock frequency of the HomePNA 1.0 module. Hence, each waveform pulse transmitted by the HomePNA 1.0 module and output through the DAC circuit shall drift from its desired timing due to the frequency difference in these two clock domains. Timing accuracy requirement of the transmitted waveform is, therefore, violated as if the system master clock had a big jitter.

To achieve jitter reduction, two possible approaches have been suggested as follows:
1. Double the DAC clock frequency and pre-filter signal waveform samples; and
2. Double the DAC clock frequency and implement an analog filter in the analog front-end circuit to perform filtering on a set of square waveform driven by a system clock.

Both above conventional approaches will reduce the jitter to half of its original design. However, these methods need either a DAC circuit that performs the digital-to-analog conversion at a double speed or an analog filter in the analog front-end to smooth a raw digital square waveform that is clocked to the DAC circuit at the same double speed. The later complicates the analog front-end circuit design since an analog filter is required.

SUMMARY OF THE INVENTION

Therefore, an object of the present invention is to provide a digital-to-analog converting device and method for reducing clock jitter in a digital communication system, which need only a half of DAC clock frequency as compared with that in either of the conventional approaches to achieve the same jitter performance.

Another object of the present invention is to provide a digital-to-analog converting device and method for reducing clock jitter in a digital communication system, which involve in a reduced clock jitter without significantly increasing the complexity of the circuit, and thus be cost-efficient.

A first aspect of the present invention relates to a digital-to-analog converter for generating an analog signal in response to a first clock signal having a first period and a second clock signal having a second period. The converter includes a phase monitor generating an index signal according to a phase relationship between the first and the second clock signals; a first waveform sample table storing therein a first set of waveform samples, and enabled by the first clock signal to sequentially output the first set of waveform samples in response to a series of triggering of the second clock signal; a second waveform sample table storing therein a second set of waveform samples, and enabled by the first clock signal to sequentially output the second set of waveform samples in response to a series of triggering of the second clock signal, wherein the second set of waveform samples has a delay time less than the second period from the first set of waveform samples; a multiplexer electrically connected to the phase monitor, and the first and second waveform sample tables for permitting one of the first and second sets of waveform samples to be outputted in response to the index signal; and a digital-to-analog circuit electrically connected to the multiplexer for converting the waveform samples outputted through the multiplexer into an analog signal.

The converter can be used in a digital communication system in which the first period is a non-integer multiple of the second period.

Preferably, the delay time between the first and second sets of waveform samples is equal to a half of the second period.

A second aspect of the present invention relates to a digital-to-analog converter for generating an analog signal in response to a first clock signal having a first period $T_A$ and a second clock signal having a second period $T_B$. The converter includes a phase monitor generating an index signal according to a phase relationship between the first and the second clock signals; a plurality of waveform sample tables storing therein a plurality of sets of waveform samples, respectively, each of which is enabled by the first clock signal to sequentially output the set of waveform samples in response to a series of triggering of the second clock signal, wherein a delay time is present between every two adjacent sets of waveform samples, and an overall delay time between the earliest and the latest sets of waveform samples is less than the second period; a multiplexer electrically connected to the phase monitor, and the plurality of waveform sample tables for permitting one of the plurality of sets of waveform samples to be outputted in response to the index signal; and a digital-to-analog circuit electrically connected to the multiplexer for converting the waveform samples outputted through the multiplexer into an analog signal.

For a digital communication system in which the first period is a non-integer multiple of the second period, it is given that $n_A*T_A = n_B*T_B$ in which $n_A$ and $n_B$ are positive integers, and the converter preferably includes $n_A$ waveform sample tables.

A third aspect of the present invention relates to a method for converting a digital signal into an analog signal in response to a first clock signal having a first period and a second clock signal having a second period. The method includes steps of monitoring a phase relationship between the first and second clock signals; starting transmission of a plurality of pre-stored series of waveform samples in response to each rising edge of the first clock signal, wherein a phase difference is present between every two adjacent series of waveform samples; outputting the waveform samples of each series in response to rising edges of the second clock signal; and converting one of the plurality of pre-stored sets of waveform samples into an analog signal to be outputted according to the phase relationship.

In an embodiment, two series of waveform sample are pre-stored for being optionally converted into the analog signal. Preferably, a second series of waveform samples has a delayed phase relevant to a half of the second period from a first series of waveform samples. The second series of waveform samples is selected to be converted into the analog signal in a case that the transmission is started between a rising edge and the following falling edge of the second clock signal, and the first series of waveform samples is selected to be converted into the analog signal in a case that the transmission is started between a falling edge and the following rising edge of the second clock signal.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
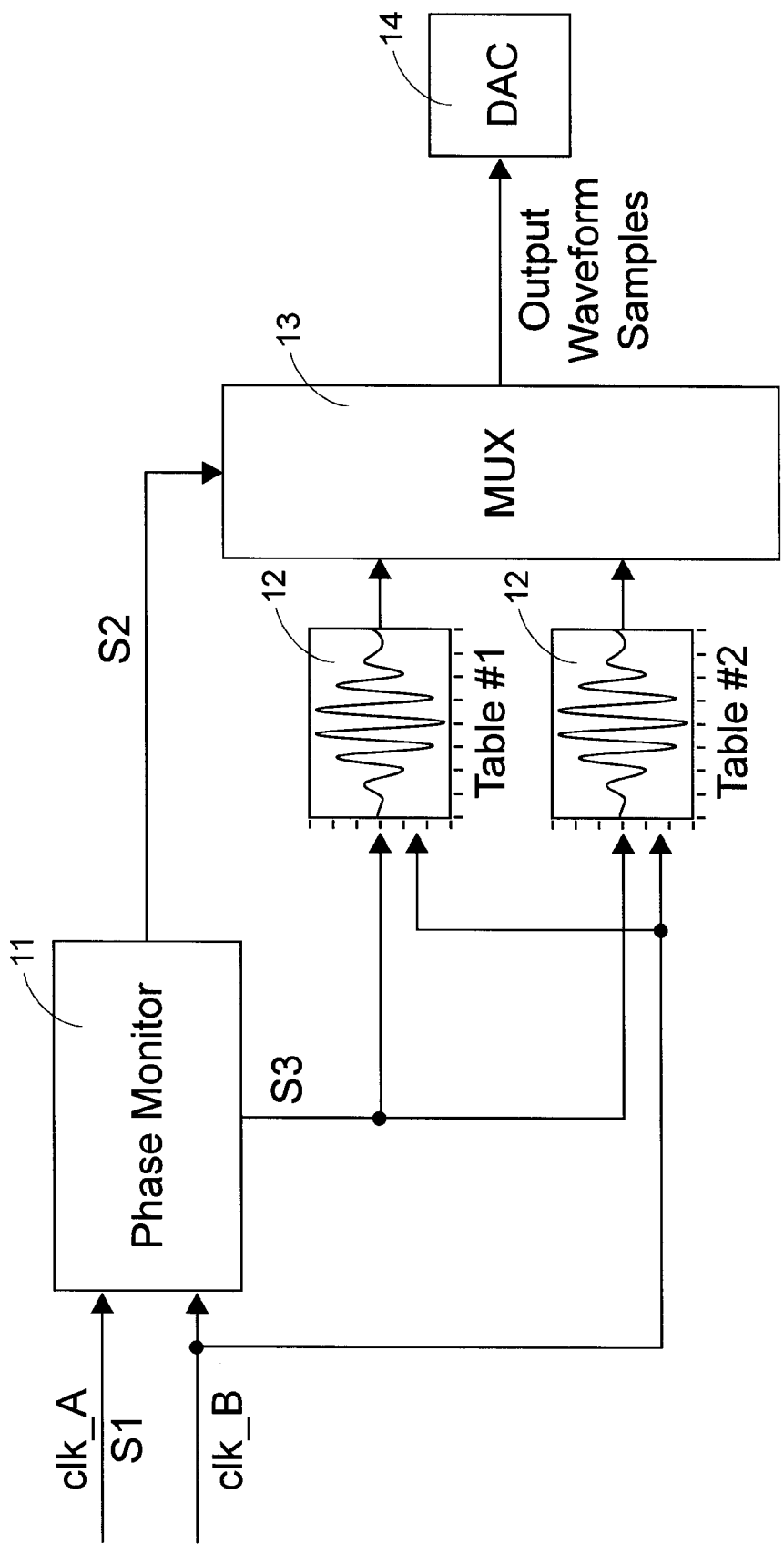
FIG. 1 is a schematic block diagram showing a preferred embodiment of a digital-to-analog converter according to the present invention.

When a DAC is used in a digital communication system for data conversion from a digital domain to an analog domain, its driving clock usually has a frequency the same as or being an integer multiple of the system clock. Otherwise, a transmitted waveform pulse will be apart from its ideal timing by certain amount as transmission continues. That is, a jitter in the transmitted waveform is introduced in addition to the jitter of the system clock. This additional jitter is caused by the frequency difference and, thus, synchronization between system clock and the DAC clock. The maximum value of this jitter is typically as large as a DAC clock cycle. A method for reducing such jitter according to the present invention is illustrated hereinafter with reference to FIG. 1.

It is assumed that the system clock clk_A has a period of $T_A$ and the DAC clock clk_B has a period of $T_B$. A transmission event is denoted by, for example, the rising edge of a transmission enable signal S1 driven by clk_A. When the transmission event occurs, a set of waveform samples are sent to a digital-to-analog converting (DAC) circuit 14 at the rising edges of clk_B. Please refer to FIG. 1 which is a schematic block diagram showing a preferred embodiment of a digital-to-analog converter according to the present invention. The converter includes a phase monitor 11, two waveform sample tables 12, a multiplexer 13 and a DAC circuit 14. The phase monitor 11 monitors the phases of the transmission enable signal S1 and clk_B in the block 11 to obtain a phase index signal S2. Meanwhile, an output enable signal S3 is outputted to generate two sets of waveform samples. The first set of samples is obtained by sampling a signal waveform pulse of interest at the rising edges of clk_B, and stored in a table #1, and the second set of waveform samples is obtained by sampling the same signal waveform at the same rising edges of clk_B with $T_B/2$ delay, and stored in a table #2. In response to the state of the phase index signal S2, one of the two sets of waveform samples is selected to be multiplexly outputted as the output waveform samples to the DAC circuit 14.

The set of waveform samples to be transmitted is selected according to the following criteria. When the transmission enable signal S1 clocked by clk_A appears between a rising edge and the following falling edge of clk_B, samples of the table #2 are clocked by clk_B and sent sequentially to the DAC circuit 14 and transmitted. On the other hand, when the transmission enable signal S1 appears between a falling edge and the following rising edge of clk_B, samples of the table #1 are clocked by clk_B and sent sequentially to the DAC circuit 14 and transmitted. Detailed analysis reveals that the maximum jitter in transmitting signal would be $T_B/2$ instead of a whole clk_B clock cycle.

In order to further describe the present invention in details, an example is given on the basis of the use of HomePNA 1.0 module along with a DAC for HomePNA 2.0 system.

Figure 2:
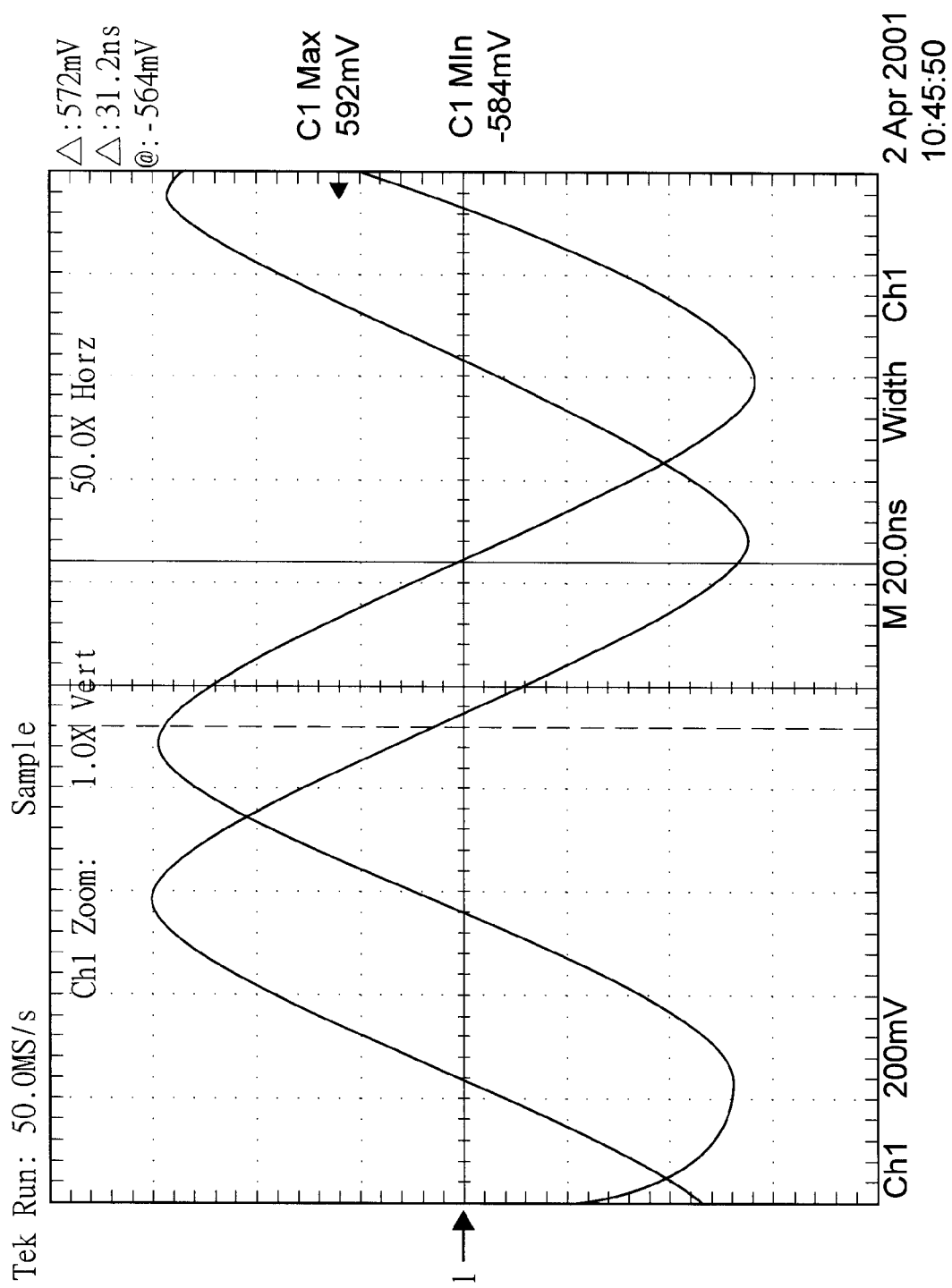
FIG. 2 shows the jitter in the transmitted waveform captured by a scope without a digital jitter reduction technique.
Figure 3:
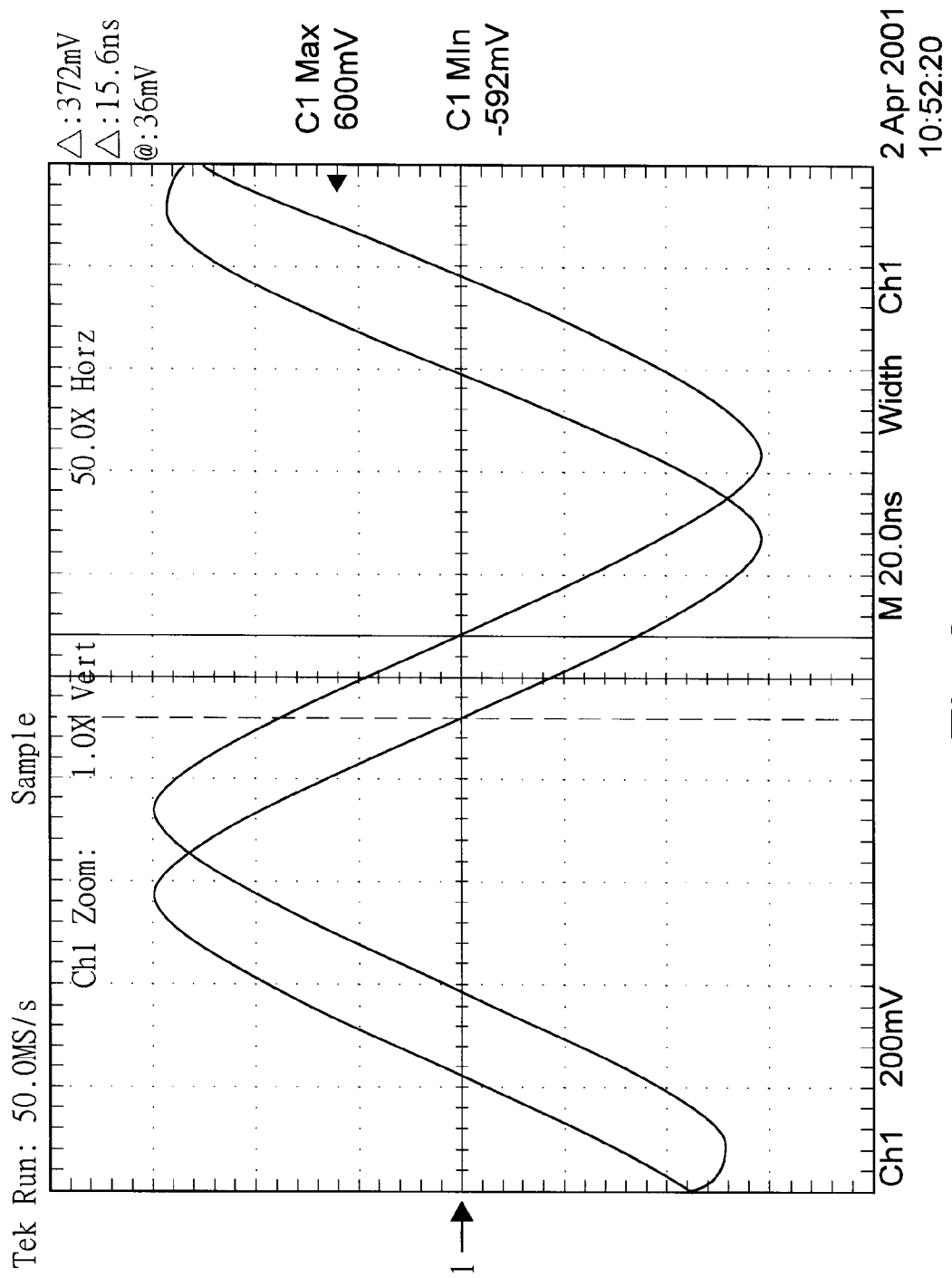
FIG. 3 shows the jitter in the transmitted waveform captured by a scope with a digital jitter reduction technique implemented in the system according to the present invention.

A HomePNA 1.0 waveform is intended to be transmitted on a 60/7 MHz (clk_A) clock domain to meet timing requirements in the HomePNA 1.0 module, while the DAC is clocked with a 32 MHz (clk_B) clock for HomePNA 2.0 system requirements. FIG. 2 shows the jitter in the transmitted waveform captured by a scope without a digital jitter reduction technique, and FIG. 3, on the other hand, shows the output transmitted waveforms captured by a scope with a digital jitter reduction technique implemented in the system. It is apparent from the comparison of FIGS. 2 and 3, the amount of the jitter is reduced to a half of the original one by using the D/A converter of the present invention.

Therefore, by using the jitter reduction technique according to the present invention, only a half DAC clock frequency as compared with that in conventional approaches is required to achieve the same jitter performance. Thus, the present method reduces DAC's conversion rate and its complexity significantly. It would make the design of a DAC circuit and whole system relatively easy. In addition, it also reduces the complexity of a clock generation circuit, and thus overall system cost is therefore reduced.

It is to be noted that two sets of waveform samples are available for selection to be outputted in the above embodiment and example. To further reduce the clock jitter, a third or further set of waveform samples may be selected as the output waveform samples. For example, the additional set of waveform samples can be derived from the existent set by using some types of numerical operations like additions, subtractions, or interpolations, etc.

The above procedure can be easily extended to reduce the clock jitter even further in general as follows:

1. Let the system clock be clk_A with a period $T_A$ and the DAC clock (sample frequency) clk_B with a period $T_B$. A transmission event is denoted as the rising edge of a transmission enable signal driven by clk_A. A set of waveform samples is properly selected and sent to DAC circuit at the rising edges of clk_B.
2. To select a proper set of waveform samples to transmit, the smallest positive integer $n_A$, and $n_B$ are determined to satisfy the following equation:

$$n_A * T_A = n_B * T_B \quad n_A, n_B \text{ are positive integers}$$

The above equation reveals that the phase shifts between the rising edges of clk_A and clk_B repeat for every $n_A$ clk_A's periods. The phase shift is defined as the time lag of clk_B's rising edge relative to that of clk_A.

3. Find the repeating sequence $\{d_1, \ldots, d_{nA}\}$ of the phase shifts between clk_A and clk_B given that both clk_A and clk_B start with, for example, zero phase shift between each other. There are $n_A$ different phase shifts $\{\Delta_1, \ldots, \Delta_{nA}\}$ ordered from small to large, where $\Delta_i$ (belongs to) $\in \{d_1, \ldots, d_{nA}\}$, $i=1 \ldots n_A$.
4. $n_A$ sets of waveform samples associated with $\{\Delta_1, \ldots, \Delta_{nA}\}$ are generated. Each set of samples is obtained by sampling a signal waveform of interest at the consecutive edges of clk_B for a certain periods, and the starting sample of each set is delayed with respect to the target waveform by $\{\Delta_1, \ldots, \Delta_{nA}\}$ respectively. The target waveform is usually a pulse of finite duration. The stored samples in each set thus represent those meaningful samples with values that cannot be ignored without sacrificing noticeable system performance.
5. Maintain control signals that monitor the phase shift relationship between clk_A and clk_B according to $\{d_1, \ldots, d_{nA}\}$. The control signals can be generated from a circuit as simple as a counter, driven by clk_A or clk_B whose contents change in synchronous with the changes of phase shifts between clk_A and clk_B. The contents of this counter typically change from (but not limited to) 1 to $n_A$.
6. Whenever a tx-event (driven by clk_A) is latched on a clk_B's rising edge, starting from the next rising edge of clk_B waveform samples are sequentially sent to DAC from the set that corresponds to the phase shift between clk_A and clk_B at the moment the tx-event is enabled.
7. A common constant delay in each set of waveform samples is allowed, and the jitter performance is maintained. The only restriction in this general case is that the ratio between clk_A's and clk_B's periods $T_A$ and $T_B$ respectively should be rational to satisfy their relationship defined in 2.

Figure 4:
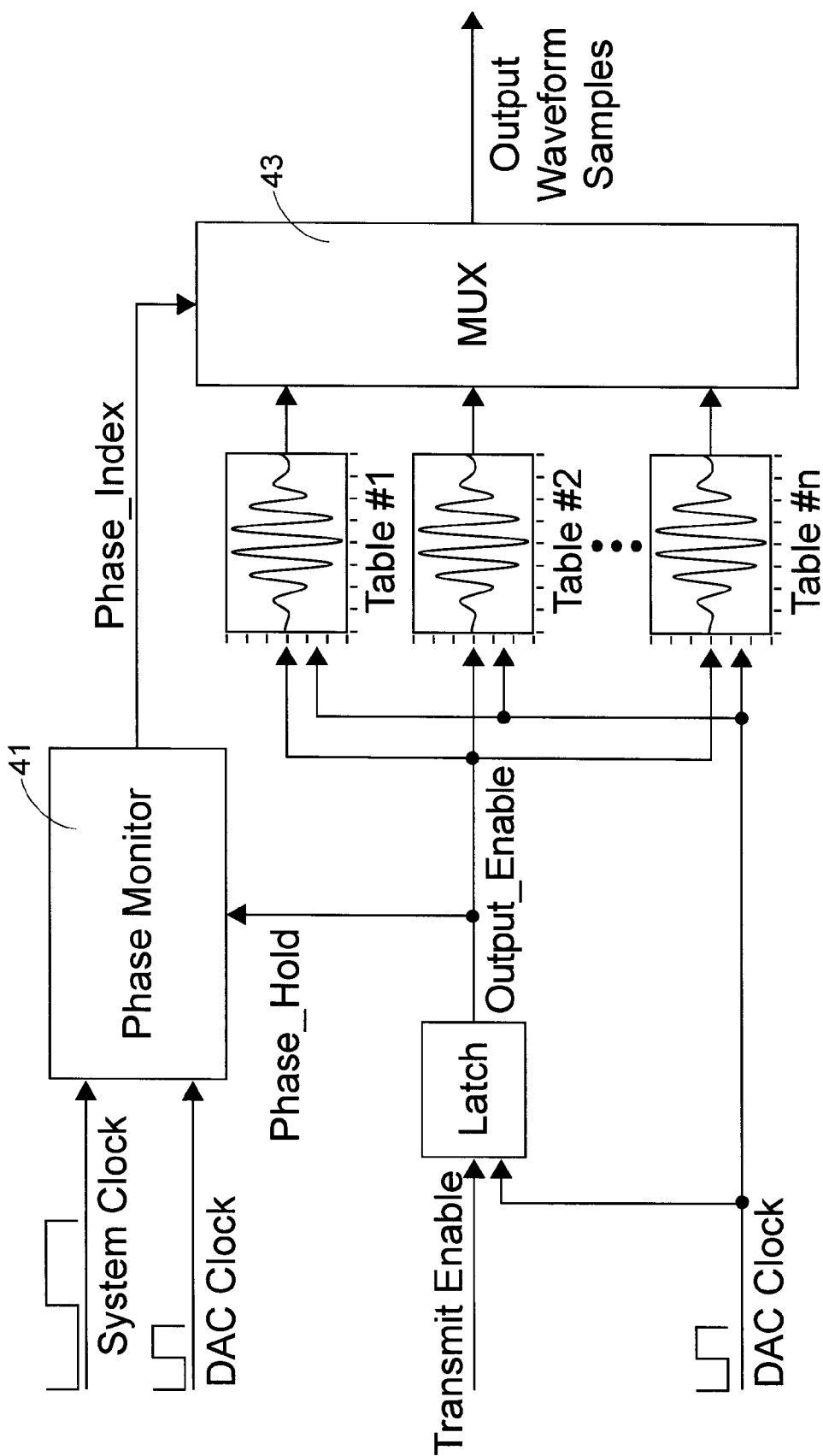
FIG. 4 is a schematic block diagram showing another preferred embodiment of a digital-to-analog converter according to the present invention.

The block diagram is schematically shown in FIG. 4. There are $n_A$ tables of waveform samples, namely Table #1, Table #2 . . . and Table # $n_A$, generated as described above. The phase monitor 41 keeps tracking the phase relationship between system clock and DAC clock and asserts the Phase_Hold signal when necessary. Once Transmit_Enable signal is activated, Output_Enable signal (and Phase_Hold too) is asserted and lasts for a duration of a waveform's period. During that period, Phase_Index indicates the phase shift relation between the two (system's and DAC's) clocks when a transmission event occurs. The multiplexer 43 then selects the waveform samples to be delivered to the output according to the value of Phase_Index as well as following the rules described above.

Since more tables are needed in this embodiment, it costs more to reduce jitter further in the general case than the special two-set table version—it is a tradeoff between jitter performance and hardware complexity. However, the price for better jitter performance is little since hardware memories do not cost much in today's VLSI technology.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A digital-to-analog converter for generating an analog signal in response to a first clock signal having a first period and a second clock signal having a second period, comprising:

a phase monitor generating an index signal according to a phase relationship between said first and said second clock signals;

a first waveform sample table storing therein a first set of waveform samples, and enabled by said first clock signal to sequentially output said first set of waveform samples in response to a series of triggering of said second clock signal;

a second waveform sample table storing therein a second set of waveform samples, and enabled by said first clock signal to sequentially output said second set of waveform samples in response to a series of triggering of said second clock signal, wherein said second set of waveform samples has a delay time less than said second period from said first set of waveform samples;

a multiplexer electrically connected to said phase monitor, and said first and second waveform sample tables for permitting one of said first and second sets of waveform samples to be outputted in response to said index signal; and a digital-to-analog circuit electrically connected to said multiplexer for converting said waveform samples outputted through said multiplexer into an analog signal.

2. The converter according to claim 1 wherein said first period is a non-integer multiple of said second period.

3. The converter according to claim 1 wherein said delay time between said first and second sets of waveform samples is equal to a half of said second period.

4. A digital-to-analog converter for generating an analog signal in response to a first clock signal having a first period $T_A$ and a second clock signal having a second period $T_B$, comprising:

a phase monitor generating an index signal according to a phase relationship between said first and said second clock signals;

a plurality of waveform sample tables storing therein a plurality of sets of waveform samples, respectively, each of which is enabled by said first clock signal to sequentially output said set of waveform samples in response to a series of triggering of said second clock signal, wherein a delay time is present between every two adjacent sets of waveform samples, and an overall delay time between the earliest and the latest sets of waveform samples is less than said second period;

a multiplexer electrically connected to said phase monitor, and said plurality of waveform sample tables for permitting one of said plurality of sets of waveform samples to be outputted in response to said index signal; and a digital-to-analog circuit electrically connected to said multiplexer for converting said waveform samples outputted through said multiplexer into an analog signal.

5. The converter according to claim 4 wherein said first period is a non-integer multiple of said second period, and $n_A*T_A=n_B*T_B$ in which $n_A$ and $n_B$ are positive integers.

6. The converter according to claim 5 wherein said converter includes $n_A$ waveform sample tables.

7. A method for converting a digital signal into an analog signal in response to a first clock signal having a first period and a second clock signal having a second period, comprising steps of:

monitoring a phase relationship between said first and second clock signals;

starting transmission of a plurality of pre-stored series of waveform samples in response to each rising edge of said first clock signal, wherein a phase difference is present between every two adjacent series of waveform samples;

outputting said waveform samples of each series in response to rising edges of said second clock signal; and selecting one of said plurality of pre-stored sets of waveform samples to be converted into an analog signal according to said phase relationship.

8. The method according to claim 7 wherein a first and a second series of waveform sample are pre-stored for being optionally converted into said analog signal, and said second series of waveform samples has a delayed phase relevant to a half of said second period from said first series of waveform samples.

9. The method according to claim 8 wherein said second series of waveform samples is selected to be converted into said analog signal in a case that said transmission is started between a rising edge and the following falling edge of said second clock signal, and said first series of waveform samples is selected to be converted into said analog signal in a case that said transmission is started between a falling edge and the following rising edge of said second clock signal.

* * * * *